(12) United States Patent
Inoue et al.

(10) Patent No.: US 11,034,623 B2
(45) Date of Patent: Jun. 15, 2021

(54) THERMAL CONDUCTIVE MEMBER AND HEAT DISSIPATION STRUCTURE INCLUDING THE SAME

(71) Applicant: DENKA COMPANY LIMITED, Tokyo (JP)

(72) Inventors: Saori Inoue, Omuta (JP); Toshitaka Yamagata, Omuta (JP); Yoshitaka Minakata, Omuta (JP); Ryo Yoshimatsu, Omuta (JP); Ryuji Koga, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 16/498,648

(22) PCT Filed: Mar. 28, 2018

(86) PCT No.: PCT/JP2018/013026
§ 371 (c)(1),
(2) Date: Sep. 27, 2019

(87) PCT Pub. No.: WO2018/181606
PCT Pub. Date: Oct. 4, 2018

(65) Prior Publication Data
US 2020/0031723 A1  Jan. 30, 2020

(30) Foreign Application Priority Data
Mar. 29, 2017 (JP) .............................. JP2017-065991

(51) Int. Cl.
*C04B 35/583* (2006.01)
*H01L 23/34* (2006.01)
(Continued)

(52) U.S. Cl.
CPC ............ *C04B 35/583* (2013.01); *C04B 41/83* (2013.01); *H01L 23/345* (2013.01);
(Continued)

(58) Field of Classification Search
CPC ..... C04B 35/583; C04B 41/83; H01L 23/345; H01L 23/373
(Continued)

(56) References Cited

U.S. PATENT DOCUMENTS

2012/0067145 A1  3/2012  Suzuki et al.
2012/0119346 A1  5/2012  Im et al.
(Continued)

FOREIGN PATENT DOCUMENTS

JP    H05-82760 A    4/1993
JP    2005-159318 A  6/2005
(Continued)

OTHER PUBLICATIONS

Fujiwara et al., JP-2005159318-A machine translation, Jun. 16, 2006, entire machine translation (Year: 2005).*
(Continued)

*Primary Examiner* — Humera N. Sheikh
*Assistant Examiner* — Katherine A Christy
(74) *Attorney, Agent, or Firm* — Oliff PLC

(57) ABSTRACT

A thermal conductive member includes: first and second surface layers including an insulating material A, and an intermediate layer including an insulating material B. The insulating material A includes a first boron nitride sintered body having an orientation degree of hexagonal boron nitride primary particles of 0.6 to 1.4, and a first heat curable resin composition impregnating in the first boron nitride sintered body. The insulating material B includes a second boron nitride sintered body having an orientation degree of hexagonal boron nitride primary particles of 0.01 to 0.05,
(Continued)

and a second heat curable resin composition impregnating in the second boron nitride sintered body.

7 Claims, 1 Drawing Sheet

(51) Int. Cl.
*C04B 41/83* (2006.01)
*H01L 23/373* (2006.01)
*C04B 111/00* (2006.01)

(52) U.S. Cl.
CPC ... *H01L 23/373* (2013.01); *C04B 2111/00465* (2013.01); *C04B 2235/386* (2013.01)

(58) Field of Classification Search
USPC ........................................................ 428/698
See application file for complete search history.

(56) References Cited

U.S. PATENT DOCUMENTS

| | | |
|---|---|---|
| 2014/0247556 A1 | 9/2014 | Eid et al. |
| 2016/0227644 A1 | 8/2016 | Hirotsuru et al. |
| 2017/0036963 A1 | 2/2017 | Ikarashi et al. |

FOREIGN PATENT DOCUMENTS

| | | | | |
|---|---|---|---|---|
| JP | 2005159318 A | * | 6/2005 | |
| JP | 2010-275149 A | | 12/2010 | |
| JP | 2015-096456 A | | 5/2015 | |
| KR | 20160016857 A | * | 2/2016 | ............. C04B 41/48 |
| WO | 2005/048298 A2 | | 5/2005 | |
| WO | WO-2010047278 A1 | * | 4/2010 | ............. C09K 5/14 |
| WO | 2014/196496 A1 | | 12/2014 | |
| WO | WO-2014199650 A1 | * | 12/2014 | ............. C08L 101/00 |
| WO | 2015/022956 A1 | | 2/2015 | |

OTHER PUBLICATIONS

Mitsuru et al, KR-20160016857-A machine translation, Feb. 15, 2016, entire machine translation (Year: 2016).*
Motoki et al., WO-2014199650-A1 machine translation, Dec. 18, 2014, entire machine translation (Year: 2014).*
Tooru et al., WO-2010047278-A1 machine translation, Mar. 22, 2012, entire machine translation (Year: 2012).*
May 1, 2018 International Search Report issued in International Patent Application No. PCT/JP2018/013026.
Oct. 10, 2019 International Preliminary Report on Patentability issued in International Patent Application No. PCT/JP2018/013026.
Mar. 25, 2020 Extended Search Report issued in European Patent Application No. 18 77 7303.1.
Mar. 29, 2021 Office Action issued in European Application No. 18777303.1.

* cited by examiner

THERMAL CONDUCTIVE MEMBER AND HEAT DISSIPATION STRUCTURE INCLUDING THE SAME

TECHNICAL FIELD

The present invention provides a thermal conductive member having a small thermal conductivity anisotropy and higher reliability, and a heat dissipation structure including the same.

BACKGROUND ART

Heat-generating electronic components such as power devices, double-side heat dissipation transistors, thyristors, and CPUs are facing an important task of efficient heat dissipation during their use. Conventionally, some heat dissipation measures have been conducted: (1) improving thermal conductivity of an insulating layer in a printed-wiring board (or printed circuit board) onto which the heat-generating electronic components are to be mounted, and (2) attaching the heat-generating electronic components or the printed-wiring board having the heat-generating electronic components to a heatsink via thermal interface materials having electric insulation. A thermal conductive member obtained by curing silicone resin and epoxy resin added with ceramics powder is used for the insulating material of the printed-wiring board and the thermal interface materials.

In recent years, higher-speed and higher-integration of circuits in the heat-generating electronic components and increase in the higher mounting density of the heat-generating electronic components on the printed-wiring board leads to increase the heat generation density inside of the electronic devices year by year. Therefore, a thermal conductive member has been required to have higher thermal conductivity than conventional one. Furthermore, the thermal conductive member is required not only to dissipate heat in only one direction of the thickness direction or the plane direction conventionally, but also to highly dissipate heat in both of the thickness direction and the plane direction.

From the afore-mentioned circumstances, hexagonal boron nitride powder having good properties such as (1) higher thermal conductivity and (2) higher electric insulating property has been focused. Boron nitride has a thermal conductivity in the in-plane direction (a-axis direction) of 400 W/(m·K), which is higher than that of aluminum nitride or silicon nitride, but has a thermal conductivity in the thickness direction (c-axis direction) of 2 W/(m·K), thereby, the anisotropy of the thermal conductivity is larger due to the crystal structure and the flake-shape thereof. Accordingly, when the in-plane direction (a-axis direction) of the boron nitride particles is perpendicular to the thickness direction of the thermal interface material, for example, during manufacturing the thermal interface materials, the higher thermal conductivity of the in-plane direction (a-axis direction) of the boron nitride particles could not be sufficiently effective.

Patent Document 1 discloses a substrate for an electronic circuit comprising a ceramic composite characterized in that a resin is filled in open pores of a porous ceramic sintered body having a three-dimensional network-like crystal structure and the open pores, wherein the porous ceramic sintered body is comprised of a ceramic material of crystal grains having an average crystal grain size of 10 μm or less. However, the conventional method of Patent Document 1 cannot reduce the anisotropy of the thermal conductivity, because the flake-shape boron nitride particles are oriented in one direction.

Patent Document 2 discloses a ceramic member which is a sintered body containing at least forsterite and boron nitride as main components, wherein the boron nitride is oriented in one direction, a probe holder formed by using the ceramic member, and a method of the ceramic member. In the conventional method of Patent Document 2, the IOP (the Index of Orientation Preference) of the flake-shape boron nitride is as large as 0.07 or less, and the flake-shape boron nitride particles are oriented in one direction, thereby, the anisotropy of the thermal conductivity cannot be reduced.

The conventional thermal conductive member used in the electronic components and having larger anisotropy have been facing the difficulty in achieving further minimization of the electronic devices, because the cooling unit and the heat transport unit cannot be disposed freely. Accordingly, it is strongly expected to develop the thermal conductive member having higher thermal conductivity and smaller anisotropy of thermal conductivity.

Patent Document 3 discloses a heat dissipation member having smaller anisotropy of the thermal conductivity, wherein the heat dissipation member is prepared by a boron nitride sintered body with a small degree of orientation of boron nitride crystals by three-dimensionally bonded and improved contacted with flake-shape boron nitride particles having a specific calcium content, a graphitization index of boron nitride, and an average particle diameter appropriately controlled, and resin-impregnated boron nitride sintered body. Although such method improves the anisotropy of the thermal conductivity, the IOP of the boron nitride particles decreases and the thermal conductivity in the in-plane direction (a-axis direction) of 400 W/(m·K) is not utilized efficiently, resulting in insufficient improvement of the thermal conductivity.

CITATION LIST

Patent Literature

Patent Document 1: Japanese Patent Application Laid-open Publication No. H05-82760A
Patent Document 2: Japanese Patent Application Laid-open Publication No. 2010-275149A
Patent Document 3: WO2015/022956

SUMMARY OF INVENTION

Technical Problem

A thermal conductive member having higher heat dissipation and smaller anisotropy of the thermal conductivity, which cannot be achieved by the prior art as described above, has been required.

Solution to Problem

In order to solve the problems of the prior art described above, the present inventors have found that a thermal conductive member having higher heat dissipation and smaller anisotropy of thermal conductivity, which cannot be achieved by the prior art as described above, can be produced by disposing an insulating material A as a surface layer, which is comprised of a boron nitride-resin composite by compounding a resin with a boron nitride sintered body having a smaller anisotropy of the thermal conductivity, and an insulating material B at the center of the insulating material A, which is comprised of a boron nitride-resin composite by compounding a resin with a boron nitride sintered body having larger anisotropy of the thermal conductivity and high thermal conductivity, and achieved the present invention.

The present invention provides a thermal conductive member having higher heat dissipation and smaller anisotropy of thermal conductivity, which is suitably used for thermal conductivity applications of heat-generating electronic components such as power devices, in particular, used for insulating layers of printed-wiring boards, thermal interface materials, substrates for power modules and double-sided heat dissipation power modules for automobiles. That is, the present invention may adopt the following aspects.

(1)
A thermal conductive member, comprising:
a first surface layer comprising an insulating material A;
a second surface layer comprising an insulating material A; and
an intermediate layer comprising an insulating material B, and disposed between the first surface layer and the second surface layer,
wherein the insulating material A comprises a first boron nitride sintered body having an orientation degree of hexagonal boron nitride primary particles of 0.6 to 1.4, and a first heat curable resin composition impregnating in the first boron nitride sintered body, and
wherein the insulating material B comprises a second boron nitride sintered body having an orientation degree of hexagonal boron nitride primary particles of 0.01 to 0.05, and a second heat curable resin composition impregnating in the second boron nitride sintered body,
provided that the orientation degree means the IOP (the Index of Orientation Preference), and calculated by the following equation:

$$IOP=(I100/I002)_{par.}/(I100/I002)_{perp.},$$

wherein, $(I100/I002)_{par.}$ is an intensity ratio of the planes measured along a direction parallel to a thickness direction of the boron nitride sintered body, and $(I100/I002)_{perp.}$ is an intensity ratio of the planes measured along a direction perpendicular to the thickness direction of the boron nitride sintered body, I100 indicates an intensity of a X-ray diffraction from the (100) plane, and I002 indicates an intensity of a X-ray diffraction from the (002) plane.

(2)
The thermal conductive member according to (1), wherein the content of the boron nitride sintered body contained in at least one of the insulating material A and the insulating material B is a range of 20 volume % or more and 80 volume % or less based on the volume of the insulating materials.

(3)
A heat dissipation structure for an electric circuit device, comprising a cooler disposed in contact with a heat dissipation plate via the thermal conductive member according to (1) or (2).

Advantageous Effects of Invention

The present invention can provide a thermal conductive member having higher heat dissipation and smaller anisotropy of thermal conductivity, which cannot be achieved by the prior art as described above, can be produced by disposing an insulating material A as a surface layer, which is comprised of a boron nitride-resin composite by compounding a resin with a boron nitride sintered body having a smaller anisotropy of the thermal conductivity, and an insulating material B at the center of the insulating material A, which is comprised of a boron nitride-resin composite by compounding a resin with a boron nitride sintered body having larger anisotropy of the thermal conductivity and higher thermal conductivity, and achieved the present invention.

BRIEF DESCRIPTION OF THE DRAWINGS

FIG. 2 shows an example of the structure of a conventional thermal conductive member according to a prior art.
FIG. 3 shows an example of the structure of f a conventional thermal conductive member according to a prior art.

DESCRIPTION of EMBODIMENTS

Figure 1:
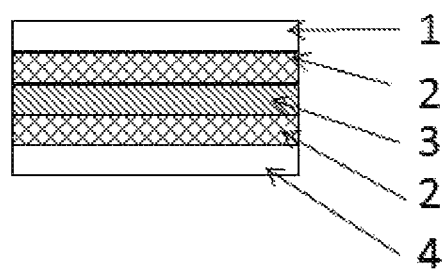
FIG. 1 shows an example of the structure of a thermal conductive member according to an embodiment of the present invention.
Figure 1:
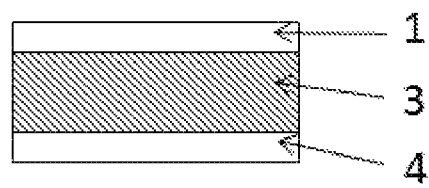
Figure 1:
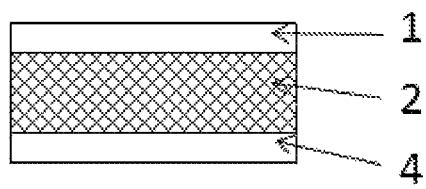

Parts and percentages (%) referred to herein show standard weight (mass), unless otherwise specified. A numerical range referred to herein (for example, it represented by a symbol tilde "~") includes its upper limit value and its lower limit value, unless otherwise specified.

The thermal conductive member according to an embodiment of the present invention comprises at least two layers of the insulating material A and the insulating material B sandwiched therebetween. The insulating material A herein comprises a boron nitride sintered body having an orientation degree (TOP, the Index of Orientation Preference) of hexagonal boron nitride primary particles of 0.6 to 1.4, and a heat curable resin composition impregnating in the boron nitride sintered body. The insulating material B herein also comprises the boron nitride sintered body having an orientation degree of hexagonal boron nitride primary particles of 0.01 to 0.05, and a heat curable resin composition impregnating in the boron nitride sintered body. The insulating material A and the insulating material B may be preferably in the form of flat plate. Each material and terms used herein will describe below.

<Boron Nitride Sintered Body, Boron Nitride Resin Composite, Insulating Material>

A "boron nitride sintered body" herein means a body in which boron nitride primary particles are sintered to form a three-dimensional continuous integral structure. A "boron nitride resin composite" means a composite composed of the boron nitride sintered body and a heat curable resin composition. An "insulating material" means the processed boron nitride resin composites (preferably in the form of a sheet).

<Heat Dissipation Plate>

A heat dissipation plate may preferably have the functions of an electrode and a heat dissipation structure, and may preferably be made of a metal having higher thermal conductivity and electrical conductivity, such as copper alloy or aluminum alloy.

<Cooler>

A cooler may be made of, for example, aluminum, and may be a water-cooled type having cooling water flowing therein, or an air-cooled type having fins.

<Definition of Orientation Degree (IOP) and Evaluation Method Thereof>

The IOP of the boron nitride primary particles can be calculated from the intensity ratio of (100) x-ray diffraction with respect to (002) x-ray diffraction measured along a direction parallel to a thickness direction of the boron nitride sintered body formed in layers (that is, the plane corresponding to the face of the layer), and the intensity ratio of (100)

diffraction with respect to (002) diffraction measured from a direction perpendicular to the thickness direction of the boron nitride sintered body (that is, the plane corresponding to the side of the layer), using the following equation:

$$IOP = (I100/I002)_{par.} / (I100/I002)_{perp.},$$

wherein, $(I100/I002)_{par.}$ is the intensity ratio of the planes measured along a direction parallel to a thickness direction, and $(I100/I002)_{perp.}$ is the intensity ratio of the planes measured along a direction perpendicular to the thickness direction, I100 indicates the intensity of a X-ray diffraction from the (100) plane, and I002 indicates the intensity of a X-ray diffraction from the (002) plane.

IOP=1 shows that the boron nitride crystals in the sample are oriented in random direction. IOP>1 shows the (100) plane of the boron nitride crystals, that is, the a-axis of the boron nitride crystals is oriented perpendicular to the thickness direction. IOP<1 shows the (100) plane of the boron nitride crystals, that is, the a-axis of the boron nitride crystals is oriented parallel to the thickness direction. Generally, it is known that the IOP of a single-layer boron nitride sintered body produced by the prior art would be 0.5 or less or 2 or more. The IOP can be measured by, for example, "D8 ADVANCE Super Speed" (manufactured by Bruker AXS). For measurement, CuKα radiation can be used for the X-ray source, the tube voltage is 45 kV, and the tube current is 360 mA. Furthermore, the IOP of the boron nitride resin composite having the heat curable resin composition impregnating in the boron nitride sintered body is substantially equal to that of such boron nitride sintered body. That is, the heat curable resin composition does not affect the measurement of the IOP.

<Proportion of the Boron Nitride Sintered Body>

The boron nitride sintered body in the boron nitride resin composite may preferably be contained in the range of 20 to 80 volume % (that is, the content of the heat curable resin composition may be 80 to 20 volume %). The boron nitride sintered body may preferably be contained in the insulating material B in the range of 30 to 70 volume % (that is, the content of the heat curable resin composition may be 70 to 30 volume %) in order to achieve both of smaller anisotropy of the thermal conductivity and the higher thermal conductivity, and the boron nitride sintered body may preferably be contained in the insulating material A in the range of 20 to 30 volume % (that is, the content of the heat curable resin composition may be 80 to 70 volume %) in order to adjust the anisotropy of the thermal conductivity between the insulating material B and the heat dissipation plate or cooler. When the content of the boron nitride sintered body is smaller than 20 volume %, the proportion of the heat curable resin composition having a low thermal conductivity is increased, resulting in the lower thermal conductivity. When the content of the boron nitride sintered body is greater than 80 volume %, the heat curable resin composition might be hardly penetrated into the unevenness of the adherend surfaces, when the adherend such as a metal plate or metal circuit is adhered to the insulating material by heating and pressing, resulting in the lower tensile shear adhesion strength and lower thermal conductivity. The proportion (volume %) of the boron nitride sintered body in the boron nitride resin composite can be determined from the measurement of the bulk density and the porosity of the boron nitride sintered body described below.

$$\text{Boron nitride sintered body bulk density}(D) = \text{mass/volume} \tag{1}$$

$$\text{Boron nitride sintered body porosity} = (1-(D/\text{true density of boron nitride})) \times 100 = \text{Proportion of the heat curable resin composition} \tag{2}$$

$$\text{Proportion of the boron nitride sintered body} = 100 - \text{proportion of the heat curable resin composition} \tag{3}$$

Although the boron nitride sintered body normally has closed pores and open pores, the closed pores of the boron nitride sintered body according to the present invention can be ignored, because they can be suppressed to 1% or less by controlling the average major diameter and aspect ratio of the boron nitride particles. Furthermore, the average pore diameter may not be particularly limited, but may be 0.1 to 3.0 μm in practical from the view of the impregnation property of the heat curable resin composition.

<Composite of Boron Nitride Sintered Body and Heat Curable Resin Composition>

The boron nitride sintered body and the heat curable resin composition according to the present invention may be composited, for example, by impregnating the heat curable resin composition in the boron nitride sintered body. The heat curable resin composition can be impregnated by vacuum impregnation, pressure impregnation at 1 to 300 MPa, or a combination thereof. The vacuum impregnation may be preferably performed at 1000 Pa or less, and more preferably 100 Pa or less. In case of the pressure impregnation at 1 MPa or less, the heat curable resin composition might not be sufficiently impregnated into the inside of the boron nitride sintered body, and in case of 300 MPa or more, a large scale of an equipment might be needed, which is disadvantageous in cost. The viscosity of the heat curable resin composition may be preferably reduced by heating at 100 to 180° C. during the vacuum impregnation and pressure impregnation for the purpose that the heat curable resin composition can be easily impregnated into the inside of the boron nitride sintered body.

<Heat Curable Resin Composition>

The heat curable resin composition may preferably be a combination of single or both of substance(s) having an epoxy group and a cyanate group and single or both of substance(s) having a hydroxyl group and a maleimide group. The substance having an epoxy group may include bisphenol A type epoxy resin, bisphenol F type epoxy resin, polyfunctional epoxy resin (such as cresol novolac epoxy resin and dicyclopentadiene type epoxy resin), cycloaliphatic epoxy resin, glycidyl ester type epoxy resin, and glycidyl amine type epoxy resin. The substance having a cyanate group may include 2,2-bis(4-cyanatophenyl) propane, bis(4-cyanato-3,5-dimethylphenyl) methane, 2,2-bis(4-cyanatophenyl) hexa-fluoropropane, 1,1-bis(4-cyanatophenyl) ethane, and 1,3-bis(2-(4-cyanatophenyl)isopropyl) benzene. The substance having a hydroxyl group may include phenol novolac resin, and 4,4'-(dimethylmethylene) bis[2-(2-propenyl)phenol]. The substance having a maleimide group may include 4,4'-diphenylmethane bismaleimide, m-phenylene bismaleimide, bisphenol A diphenyl ether bismaleimide, 3,3'-dimethyl-5,5'-dethyl-4,4'-diphenylmethane bis maleimide, 4-methyl-1,3-phenylenebismaleimide, 1,6'-bismaleimide-(2,2,4-trimethyl) hexane, 4,4'-diphenylether bismaleimide, 4,4'-diphenylsulfone bis maleimide, 1,3-bis (3-maleimidophenoxy)benzene, 1,3-bis(4-maleimidophenoxy)benzene, bis-(3-ethyl-5-methyl-4-maleimidophenyl) methane, and 2,2-bis[4-(4-maleimidophenoxy)phenyl] propane.

The heat curable resin composition may appropriately include a silane coupling agent for the purpose of improving the adhesion between the boron nitride sintered body and the heat curable resin composition, and also may include an antifoaming agent, a surface conditioner, and a wetting and dispersing agent for the purpose of improving the wettability and the leveling property and prompting the reduced viscosity to reduce the occurrence of defects during impregnation and curing. Further, the resin may more preferably include one or more ceramic powders selected from the group of aluminum oxide, silicon oxide, zinc oxide, silicon nitride, aluminum nitride, boron nitride and aluminum hydroxide.

<Pores Surface Treatment of the Boron Nitride Sintered Body>

The pores surface on the boron nitride sintered body may be subjected to surface treatment for the purpose of improving the adhesion between the boron nitride sintered body and the heat curable resin composition. The surface treatment method may include impregnating a silane coupling agent solution into the pores on the boron nitride sintered body and removing such solution by drying prior to composite with the heat curable resin composition. The silane coupling agent solution may be impregnated by vacuum impregnation, pressure impregnation at 1 to 300 MPa, or a combination thereof. Further, known ones such as water, alcohol and toluene may be used singly or in combination for such solution. A functional group which the silane coupling agent has may be suitably selected from what can reacted with the functional group which the heat curable resin has, and may include an epoxy group, a cyanate group, and an amino group.

<Semi-Curing of Heat Curable Resin Composition>

The heat curable resin composition composited with the boron nitride sintered body is semi-cured to obtain the boron nitride resin composite. A heating method may include infrared heating, hot air circulation, oil heating method, hot plate heating method, or a combination thereof. The semi-curing may be carried out by utilizing the heating function of an impregnating device after the impregnation is completed, or may be separately carried out by utilizing a known device such as a hot air circulating conveyor furnace after removing it from the impregnating device.

<Thickness of Insulating Material>

Total thickness of the insulating material comprising the thermal conductive member, that is, the total thicknesses of the two layers of the insulating material A and the insulating material B sandwiched therebetween as described above may be 0.32 mm from the view of requirement of the substrate generally used in the relevant technical field, but may be varied according to other requirements. For example, if insulation is not very important but thermal resistance is important at high voltage, 0.1 to 0.25 mm of a total thickness of a thin thermal conductive member may be used, on the other hand, if the insulation and partial discharge characteristics at high voltage are important, 0.35 to 1.0 mm thereof may be used. Moreover, the insulating material A and the insulating material B may be preferably direct-adhered without an intervening layer for the purpose of keeping heat dissipation property.

<Surface Treatment of Insulating Material>

The surface on the insulating material may be subjected to surface treatment for the purpose of improving the adhesion between the insulating materials and the heat dissipation plate and the cooler. The surface treatment method may include applying a silane coupling agent solution to the surface of the boron nitride resin composite and then removing the solution by drying prior to adhering the heat dissipation plate and the cooler to the insulating materials. Further, known ones such as water, alcohol and toluene may be used singly or in combination with for such solution. A functional group which a silane coupling agent has may be suitably selected from what can reacted with the functional group which the heat curable resin has, and may include an epoxy group, a cyanate group, and an amino group.

<Mating Surface of Heat Dissipation Plate and Cooler>

The mating surface between the heat dissipation plate and cooler and the insulating material may be subjected to surface treatment by such as degreasing treatment, sand blasting, etching, various plating treatments, and primer treatment such as silane coupling agent from the purpose of improving the performances of the insulating material and the heat dissipation plate and cooler. The surface roughness of the mating surface of the heat dissipation plate and cooler and the boron nitride resin composite may preferably be 0.1 μm to 15 μm in ten-point average roughness (Rz_jis). When the surface roughness is 0.1 μm or less, the adhesion to the insulating material might not be sufficiently obtained, and if it is 15 μm or more, defects might easily occur at the adhesion interface, and resulting in the lower voltage resistance and poor adhesion.

EXAMPLES

Hereinafter, the present invention will be described in detail by examples and comparative examples, which are provided to better understand the present invention and its advantages, and are not intended to limit the present invention.

The insulating material A, the insulating material B, the insulating material A, and the cooler were sequentially laminated in the order and assembled on the heat dissipation plate exposed to the outside of an electric circuit device to produce the structure of the thermal conductive member. Thereafter, a semiconductor device was clamped and fixed by the heat dissipation plate and the cooler using a narrow pressure member. Thus, the thermal conductive member according to this embodiment was attached to the semiconductor device.

Example 1

<Produce of Insulating Material A>
<Preparation of Boron Nitride Sintered Body>

17.50% by mass of amorphous boron nitride powder ("SP" manufactured by Denka Co., Ltd.), 7.5% by mass of hexagonal boron nitride powder ("MGP" manufactured by Denka Co., Ltd.), and 0.47% by mass of calcium carbonate ("PC-700" manufactured by Shiroishi Kogyo Co., Ltd.) were mixed with a Henschel mixer, and then 74.53% by mass of water was added and grounded in a ball mill for 5 hours to obtain a water slurry. Furthermore, 0.5% by mass of polyvinyl alcohol resin ("Gosenol" manufactured by Nippon Synthetic Chemical Co., Ltd.) was added with respect to the total mass of the obtained water slurry, and heat-stirred at 50° C. to be dissolved. After that, the spheroidizing treatment was performed by a spray dryer at 230° C. of a drying temperature. A rotary atomizer was used for the spray dryer as the spheroidizing device. The resulting treated product was filled in a boron nitride container and sintered at 2000° C. of atmospheric pressure and 5 L/min of a nitrogen flow rate in a batch type high frequency furnace, and then a sintered body was taken out from the boron nitride container to obtain the boron nitride sintered body.

Thereafter, the boron nitride sintered body was pressurized and densified at 50 MPa by a cold isostatic pressing method (hereinafter referred to as CIP).

<Impregnation of Heat Curable Resin>

Heat curable resin was impregnated into the obtained boron nitride sintered body. The boron nitride sintered body, 12.10% by mass of bisphenol F type epoxy resin ("JER 807" manufactured by Mitsubishi Chemical Corporation), 72.00% by mass of novolac type cyanate resin ("PT-30" manufactured by Lonza, sold by Japan Synthetic Chemical Industries, Ltd), 7.9% by mass of phenol novolac resin "TD-2131" (manufactured by DIC), and 8.0% by mass of 4,4̄ diphenylmethane bismaleimide resin "BMI" (manufactured by KAI CO., LTD.) were mixed and degassed in a vacuum of 70 Pa pressure for 20 minutes. Thereafter, the mixture was poured under vacuum to such an extent that the boron nitride sintered body was immersed, and impregnated for 30 minutes. Thereafter, the resin was impregnated and cured by pressurizing with a nitrogen gas at a pressure of 3 MPa and a temperature of 120° C. for 30 minutes to obtain a boron nitride resin composite. Thereafter, the resin mixture was heated to a semi-cured state by heating at 160° C. for 12 hours under atmospheric pressure. Then, such resin mixture was processed into a sheet having 160 μm of a thickness with a multi-wire saw ("MWS-32N" manufactured by Takatori Co., Ltd.) to obtain an insulating material A.

<Produce of Insulating Material B>
<Preparation of Boron Nitride Sintered Body>

34.0% by mass of amorphous boron nitride powder (1.5% of an oxygen content, and 97.6% of a boron nitride purity), 64.2% by mass of hexagonal boron nitride powder (0.3% of an oxygen content, and 99.0% of a boron nitride purity), and 1.8% by mass of calcium carbonate ("PC-700" manufactured by Shiroishi Kogyo Co., Ltd.) were mixed to prepare a mixed powder with a known technique. The mixed powder for forming, then, was pressed into the form of a block at 5 MPa. The obtained block formed compact was sintered in a batch type high frequency furnace at 10 L/min of a nitrogen flow rate to obtain a boron nitride sintered body. The obtained boron nitride sintered body was treated with CIP at 50 MPa.

<Impregnation of Heat Curable Resin>

Heat curable resin was impregnated into the obtained boron nitride sintered body. The boron nitride sintered body, 12.10% by mass of bisphenol F type epoxy resin ("JER 807" manufactured by Mitsubishi Chemical Corporation), 72.00% by mass of novolac type cyanate resin ("PT-30" manufactured by Lonza, sold by Japan Synthetic Chemical Industries, Ltd.), 7.9% by mass of phenol novolac resin "TD-2131" (manufactured by DIC), and 8.0% by mass of 4,4̄ diphenylmethane bismaleimide resin "BMI" (manufactured by KAI CO., LTD.) were mixed and degassed in a vacuum of 70 Pa pressure for 20 minutes, thereafter, the resin mixture was poured under vacuum to such an extent that the boron nitride sintered body was immersed, and impregnated for 30 minutes. Thereafter, the resin was impregnated and cured by pressurizing with a nitrogen gas at a pressure of 3 MPa and a temperature of 120° C. for 30 minutes to obtain a boron nitride resin composite. Thereafter, the resin mixture was heated to a semi-cured state by heating at 160° C. for 12 hours under atmospheric pressure. Then, such resin mixture was processed into a sheet having 160 μm of a thickness with a multi-wire saw ("MWS-32N" manufactured by Takatori Co., Ltd.) to obtain an insulating material B.

<Production of Laminates>

An insulation material A, an insulation material B, an insulation material A, and a cooler were sequentially laminated onto a heat dissipation plate in the order, and press-adhered with a vacuum heating press ("MHPC-VF-350-350-1-45" manufactured by Meiki Seisakusho Co., Ltd.) under the conditions of 5 MPa of a pressure, 200° C. of a heating temperature, and 5 hours of a heating time to obtain a laminate. In addition, each member was adhered with the resin melted from the insulating materials.

Example 2

In Example 2, the sintering temperature was set to 2100° C. for preparing the boron nitride sintered body in the production of the insulating material A, which is different from Example 1.

Example 3

In Example 3, the sintering temperature was set to 1800° C. for preparing the boron nitride sintered body in the production of the insulating material A, which is different from Example 1.

Example 4

In Example 4, CIP was set to 10 MPa for preparing the boron nitride sintered body in the production of the insulating material B, which is different from Example 1.

Example 5

In Example 5, CIP was set to 100 MPa for preparing the boron nitride sintered body in the production of the insulating material B, which is different from Example 1.

Example 6

In Example 6, CIP was not conducted for preparing the boron nitride sintered body in the production of the insulating material A, which is different from Example 1.

Comparative Example 1

In Comparative Example 1, the insulating material B was only laminated without the insulating material A, which is different from Example 1.

Comparative Example 2

In Comparative Example 2, the insulating material A was only laminated without the insulating material B, which is different from Example 1.

Comparative Example 3

In Comparative Example 3, the insulating material A and the insulating material B were laminated reversely, that is, the insulating material B, the insulating material A, the insulating material B, and the cooler were laminated in this order on the heat dissipation plate, which is different from Example 1.

Comparative Example 4

In Comparative Example 4, the sintering temperature was set to 2300° C. for preparing the boron nitride sintered body in the production of the insulating material A, and IOP of the Insulating material A fell below 0.6, which is different from Example 1.

Comparative Example 5

In Comparative Example 5, 3.30% by mass of amorphous boron nitride powder ("SP" manufactured by Denka Ltd.), 29.7% by mass of hexagonal boron nitride powder ("MGP" manufactured by Denka Ltd.) and 0.62% by mass of calcium carbonate ("PC-700" manufactured by Shiroishi Kogyo Co., Ltd.) were mixed with a henschel mixer, thereafter 66.38% by mass of water was added and pulverized in a ball mill for 5 hours, in the production of the insulating material A, and the IOP of the insulating material A exceeded 1.4, which is different from Example 1.

Comparative Example 6

In Comparative Example 6, CIP was set to 150 MPa for preparing the boron nitride sintered body in the production of the insulating material B, and the IOP of the insulating material B exceeded 0.05, which is different from Example 1.

<Thermal Resistivity>

The thermal resistivity referred to herein is not a thermal resistivity of insulating materials alone, but also a thermal resistivity including the interface thermal resistance between the insulating materials and the heat dissipation plate, and the insulating materials and the cooler. For measurement, the laminated sample in which both surfaces of the insulating materials were adhered to the heat dissipation plate and the cooler was used, and its transient thermal resistance was measured. Specifically, the time change (time history) was measured until the chip temperature actual value achieves a substantially constant value, when a constant heating amount was given to the chip for the heater. In this embodiment, "T3Ster" manufactured by Mentor Graphics Corporation was used as a device for measuring the time change of the chip temperature actual value Ta.

<Evaluation of Dielectric Breakdown Strength>

An etching resist with a 20 mm in diameter circular circuit pattern was screen-printed on one side of the laminate, and an etching resist with a solid pattern was screen-printed on the other side. The etching resist was UV-cured, the metal plate was etched with a cupric chloride solution to form a circular copper circuit having a diameter of 20 mm on one side of the laminate. Subsequently, the resist was removed with an alkaline solution and then electroless Ni—P plating was applied to the laminate with a thickness of 2 μm to obtain a circuit board for evaluation. The circuit board was immersed in an insulating oil, an alternating voltage was applied between the copper circuit and the copper plate at room temperature, and the dielectric breakdown strength was measured according to JIS C 2110-2:2016. "TOS-8700" manufactured by Kikusui Electronics Co., Ltd. was used for a measuring instrument.

<Evaluation of Heat Resistance Cycle Property>

The dielectric breakdown voltage of the boron nitride resin composite circuit board after etching was measured according to JIS C 2141: 1992. Next, the boron nitride resin composite circuit board was subjected to 1000 cycles of repeated tests in a heat resistance cycle test where one cycle is for 30 minutes at −40° C. and for 30 minutes at 125° C., and then the appearance and the adhesion state of the metal circuit were checked by an ultrasonic flaw detector. The adhesion state was compared from the adhesive area before and after the heat resistance cycle test with the ultrasonic flaw detector. In a ultrasonic flaw detection image, removed area is shown with a black portion in the adhesive portion, and therefore, the case where the area of the black portion increases before and after the heat resistance cycle test was defined as "removed". Furthermore, the dielectric breakdown voltage was measured, and the reduction rate of the dielectric breakdown voltage after 1000 heat resistance cycles was calculated by the following equation. 20% or less of a reduction rate was considered to pass.

Reduction rate of dielectric breakdown voltage after 1000 heat resistance cycles(%)=((initial breakdown voltage−breakdown voltage after 1000 heat resistance cycles)/the initial breakdown voltage)×100

The above compositions and results are summarized in the following table.

TABLE 1

| | Composition | Insulating Material | IOP | Resin content (volume %) | Thermal resistivity (° C./W) | Initial breakdown voltage (kV/mm) | Breakdown voltage after 1000 heat resistance cycles (kV/mm) | Reduction rate of breakdown voltage after 1000 heat resistance cycles (%) | Adhered state after 1000 heat resistance cycles (—) |
|---|---|---|---|---|---|---|---|---|---|
| Example 1 | FIG. 1 | A | 1.00 | 70 | 0.118 | 31.1 | 30.8 | 1.0 | Good |
| | | B | 0.042 | 30 | | | | | |
| Example 2 | FIG. 1 | A | 0.60 | 70 | 0.110 | 28.9 | 27.8 | 3.8 | Good |
| | | B | 0.042 | 30 | | | | | |
| Example 3 | FIG. 1 | A | 1.40 | 70 | 0.150 | 35.2 | 34.2 | 2.8 | Good |
| | | B | 0.042 | 30 | | | | | |
| Example 4 | FIG. 1 | A | 1.00 | 70 | 0.108 | 28.1 | 27.5 | 2.1 | Good |
| | | B | 0.01 | 50 | | | | | |
| Example 5 | FIG. 1 | A | 1.00 | 30 | 0.128 | 31.1 | 28.0 | 10.0 | Good |
| | | B | 0.05 | 70 | | | | | |
| Example 6 | FIG. 1 | A | 1.00 | 80 | 0.120 | 31.1 | 30.0 | 3.5 | Good |
| | | B | 0.042 | 30 | | | | | |
| Comparative Example 1 | FIG. 2 | B | 0.042 | 20 | 0.085 | 27.2 | 1.0 | 96.3 | Removed |
| Comparative Example 2 | FIG. 3 | A | 1.00 | 80 | 0.250 | 35.4 | 34.2 | 3.4 | Good |
| Comparative Example 3 | FIG. 1 But A and B is reversed | A | 1.00 | 30 | 0.125 | 31.2 | 0.9 | 97.1 | Removed |
| | | B | 0.042 | 30 | | | | | |

TABLE 1-continued

| | Composition | Insulating Material | IOP | Resin content (volume %) | Thermal resistivity (° C./W) | Initial breakdown voltage (kV/mm) | Breakdown voltage after 1000 heat resistance cycles (kV/mm) | Reduction rate of breakdown voltage after 1000 heat resistance cycles (%) | Adhered state after 1000 heat resistance cycles (—) |
|---|---|---|---|---|---|---|---|---|---|
| Comparative Example 4 | FIG. 1 | A | 0.40 | 70 | 0.098 | 28.5 | 0.2 | 99.3 | Removed |
| | | B | 0.042 | 30 | | | | | |
| Comparative Example 5 | FIG. 1 | A | 1.80 | 70 | 0.140 | 30.4 | 28.9 | 4.9 | Good |
| | | B | 0.042 | 30 | | | | | |
| Comparative Example 6 | FIG. 1 | A | 1.00 | 70 | 0.090 | 34.2 | 1.0 | 97.1 | Removed |
| | | B | 0.080 | 20 | | | | | |

INDUSTRIAL APPLICABILITY

The thermal conductive member according to the present invention is effective for general industrial and in-vehicle power modules.

DESCRIPTION OF CODE

1 Heat dissipation plate
2 Insulating material A formed by impregnating resin with a boron nitride sintered body (IOP=0.6 to 1.4)
3 Insulating material B formed by impregnating resin with a boron nitride sintered body (IOP=0.01 to 0.05)
4 cooler

The invention claimed is:

1. A thermal conductive member, comprising:
a first surface layer comprising an insulating material A;
a second surface layer comprising an insulating material A; and
an intermediate layer comprising an insulating material B, and disposed between the first surface layer and the second surface layer,
wherein the insulating material A comprises a first boron nitride sintered body having an orientation degree of hexagonal boron nitride primary particles of 0.6 to 1.4, and a first heat curable resin composition impregnating in the first boron nitride sintered body, and
wherein the insulating material B comprises a second boron nitride sintered body having an orientation degree of hexagonal boron nitride primary particles of 0.01 to 0.05, and a second heat curable resin composition impregnating in the second boron nitride sintered body,
provided that the orientation degree means IOP (the Index of Orientation Preference), and calculated by the following equation:

$$IOP = (I100/I002)_{par.} / (I100/I002)_{perp.},$$

wherein, $(I100/I002)_{par.}$ is an intensity ratio of the planes measured along a direction parallel to a thickness direction of the boron nitride sintered body, and $(I100/I002)_{perp.}$ is an intensity ratio of the planes measured along a direction perpendicular to the thickness direction of the boron nitride sintered body, I100 indicates an intensity of a X-ray diffraction from the (100) plane, and I002 indicates an intensity of a X-ray diffraction from the (002) plane.

2. The thermal conductive member according to claim 1, wherein the content of the boron nitride sintered body contained in at least one of the insulating material A and the insulating material B is a range of 20 volume % or more and 80 volume % or less based on the volume of the insulating materials.

3. A heat dissipation structure for an electric circuit device, comprising a cooler disposed in contact with a heat dissipation plate via the thermal conductive member according to claim 1.

4. A heat dissipation structure for an electric circuit device, comprising a cooler disposed in contact with a heat dissipation plate via the thermal conductive member according to claim 2.

5. The thermal conductive member according to claim 1, wherein the boron nitride sintered body is contained in the insulating material B in the range of 30 to 70 volume %.

6. The thermal conductive member according to claim 1, wherein the boron nitride sintered body is contained in the insulating material A in the range of 20 to 30 volume %.

7. The thermal conductive member according to claim 5, wherein the boron nitride sintered body is contained in the insulating material A in the range of 20 to 30 volume %.

* * * * *